United States Patent
Otsuka et al.

(10) Patent No.: US 9,230,845 B2
(45) Date of Patent: Jan. 5, 2016

(54) ARTICLE STORAGE FACILITY AND ARTICLE STORAGE METHOD

(71) Applicant: Daifuku Co., Ltd., Osaka-shi (JP)

(72) Inventors: Hiroshi Otsuka, Gamo-gun (JP);
Masahiro Takahara, Gamo-gun (JP);
Toshihito Ueda, Gamo-gun (JP)

(73) Assignee: Daifuku Co., Ltd., Osaka-shi (JP)

( * ) Notice: Subject to any disclaimer, the term of this patent is extended or adjusted under 35 U.S.C. 154(b) by 461 days.

(21) Appl. No.: 13/723,440

(22) Filed: Dec. 21, 2012

(65) Prior Publication Data
US 2014/0009045 A1    Jan. 9, 2014

(30) Foreign Application Priority Data

Dec. 26, 2011    (JP) .................................. 2011-284257

(51) Int. Cl.
*H01L 21/677* (2006.01)
*H01L 21/673* (2006.01)
*A47F 10/00* (2006.01)

(52) U.S. Cl.
CPC .... *H01L 21/67769* (2013.01); *H01L 21/67393* (2013.01); *A47F 10/00* (2013.01)

(58) Field of Classification Search
CPC .................................. H01L 21/67763–21/67781
USPC ........... 141/63, 65, 66; 414/222.01, 935–940; 206/710–712
See application file for complete search history.

(56) References Cited

U.S. PATENT DOCUMENTS

| | | | | |
|---|---|---|---|---|
| 6,123,120 | A * | 9/2000 | Yotsumoto et al. | 141/65 |
| 7,274,971 | B2 * | 9/2007 | Brill et al. | 700/230 |
| 8,240,346 | B2 * | 8/2012 | Goto et al. | 141/65 |
| 2002/0194995 | A1 * | 12/2002 | Shiramizu | 95/273 |
| 2004/0069647 | A1 * | 4/2004 | Mizohata et al. | 205/101 |
| 2005/0209721 | A1 * | 9/2005 | Teferra et al. | 700/100 |
| 2010/0152887 | A1 * | 6/2010 | Kawasaki | 700/228 |

FOREIGN PATENT DOCUMENTS

| | | | |
|---|---|---|---|
| JP | 05037716 | U | 5/1993 |
| JP | 2010182747 | * | 8/2010 |
| JP | 2010182747 | A | 8/2010 |
| JP | 2011228391 | A * | 11/2011 |

* cited by examiner

*Primary Examiner* — Timothy L Maust
*Assistant Examiner* — Andrew Stclair
(74) *Attorney, Agent, or Firm* — The Webb Law Firm

(57) ABSTRACT

An article storage facility comprises a plurality of storage units for storing transporting containers for substrates and inactive gas feed passages for supplying inactive gas to each of the plurality of said storage units. The plurality of storage units are divided into a plurality of sections. The inactive gas feed passages include section feeding portions which supply the inactive gas to the sections, and storage unit feeding portions which divert and supply the inactive gas, that is supplied to a respective section by an associated one of the section feeding portions, to the plurality of storage units in the respective section. The article storage facility includes a bypass portion which allows communication between two or more storage unit feeding portions, and a bypass switching valve that can be switched between an open state in which the inactive gas can be communicated through the bypass portion and a closed state in which the inactive gas cannot be communicated through the bypass portion.

7 Claims, 10 Drawing Sheets

ARTICLE STORAGE FACILITY AND ARTICLE STORAGE METHOD

FIELD OF THE INVENTION

The present invention relates to an article storage facility comprising a plurality of storage units for storing transporting containers for housing substrates, a transport device for transporting the transporting containers to the plurality of storage units, inactive gas feed passages for supplying inactive gas to each of the plurality of said storage units, a discharge portion for discharging the inactive gas supplied to an associated one of the storage units by an associated one of the inactive gas feed passages into the interior of an associated one of the transporting containers stored in the associated one of the storage units, wherein the plurality of storage units are divided into a plurality of sections, wherein the inactive gas feed passages include section feeding portions which divert and supply the inactive gas to each of the plurality of sections, and storage unit feeding portions which divert and supply the inactive gas, that is supplied to a respective section by an associated one of the section feeding portions, to each of the plurality of storage units in the respective section, as well as to an article storage method using such an article storage facility.

An example of article storage facilities such as one described above is disclosed in JP Publication of Application No. 2010-182747 (Patent Document 1). The article storage shelf with a purging function and provided in an article storage facility of Patent Document 1 includes a plurality of storage units for storing transporting containers such as FOUPs, etc. for housing semiconductor wafers. And the facility is configured to supply inactive gas, such as nitrogen gas or gaseous argon, to each of the storage units by means of inactive gas feed passages and to discharge the inactive gas to the interior of each transporting container with a discharge portion.

In the facility disclosed in Patent Document 1, the inactive gas is injected into the interior of the transporting container through the discharge portion when a transporting container is stored in a storage unit to discharge oxygen gas, vapor, etc. that have negative effects on the substrates out of the transporting container and to fill the interior of the transporting container stored in the storage unit with the inactive gas. This reduces the occurrences of negative effects, such as oxidization etc., on the substrates stored in the transporting container.

With the article storage facility of Patent Document 1 described above, however, the transporting container continues to be stored in the same storage unit even if the inactive gas is not properly supplied to the storage unit due to damage to a section feeding portion or failure of a device, such as a flow rate adjusting valve, provided at a connection between a section feeding portion and a storage unit feeding portion. Thus, the environment in a transporting container worsens if the inactive gas is not properly supplied to its storage unit, because, for example, the ambient air flows into the transporting container, allowing negative effects on the substrates in the transporting container to occur.

SUMMARY OF THE INVENTION

In light of this background, an article storage facility is desired in which negative effects on substrates in a transporting container stored in a storage unit can be prevented from occurring even when it becomes impossible to properly supply inactive gas to a storage unit.

The article storage facility in accordance with the present invention comprises:

a plurality of storage units for storing transporting containers for housing substrates;

a transport device for transporting the transporting containers to the plurality of storage units;

inactive gas feed passages for supplying inactive gas to each of the plurality of said storage units;

a discharge portion for discharging the inactive gas supplied to an associated one of the storage units by an associated one of the inactive gas feed passages into the interior of an associated one of the transporting containers stored in the associated one of the storage units;

wherein the plurality of storage units are divided into a plurality of sections, wherein the inactive gas feed passages include section feeding portions which divert and supply the inactive gas to each of the plurality of sections, and storage unit feeding portions which divert and supply the inactive gas, that is supplied to a respective section by an associated one of the section feeding portions, to each of the plurality of storage units in the respective section, wherein the article storage facility further includes a bypass portion for allowing communication between two or more of the storage unit feeding portions among the plurality of storage unit feeding portions; and a bypass switching valve that can be switched between an open state in which the inactive gas can be communicated through the bypass portion and a closed state in which the inactive gas cannot be communicated through the bypass portion.

With the above-described arrangement, the inactive gas can be allowed to flow among the plurality of storage unit feeding portions that are communicated to each other by switching the bypass switching valve to the open state. Thus, even if the amount of the inactive gas supplied to a storage unit decreases to below a proper supply amount or if the inactive gas is not supplied to the storage unit at all due to damage to a section feeding portion or failure of a device, such as a flow rate adjusting valve, provided at a connection between a section feeding portion and a storage unit feeding portion, the inactive gas can be allowed to flow, through the bypass portion, from the storage unit feeding portion of a section to which the inactive gas is properly supplied to the storage unit feeding portion of the section to which the inactive gas is not properly supplied, by switching the bypass switching valve to the open state. As a result, negative effects on the substrates that are stored in the storage units can be prevented from occurring.

The technical features of the article storage facility in accordance with the present invention can be applied also to an article storage method, which is thus within the scope of the present invention. The functions and effects associated with the article storage facility described above can be also achieved with this article storage method.

Specifically, an article storage method in accordance with the present invention is a method that uses an article storage facility that includes:

a plurality of storage units for storing transporting containers for housing substrates;

a transport device for transporting the transporting containers to the plurality of storage units;

inactive gas feed passages for supplying inactive gas to each of the plurality of said storage units; and a discharge portion for discharging the inactive gas supplied to an associated one of the storage units by an associated one of the inactive gas feed passages into the interior of an associated one of the transporting containers stored in the associated one of the storage units;

wherein the plurality of storage units are divided into a plurality of sections, wherein the inactive gas feed passages include section feeding portions which divert and supply the inactive gas to each of the plurality of sections, and storage unit feeding portions which divert and supply the inactive gas, that is supplied to a respective section by an associated one of the section feeding portions, to each of the plurality of storage units in the respective section, wherein the article storage facility further includes a bypass portion for allowing communication between two or more of the storage unit feeding portions among the plurality of storage unit feeding portions;

a bypass switching valve that can be switched between an open state in which the inactive gas can be communicated through the bypass portion and a closed state in which the inactive gas cannot be communicated through the bypass portion;

a section supply state detecting device for detecting a supply state of the inactive gas to an associated one of the plurality of sections;

a switched state detecting device for detecting a switched state of the bypass switching valve; and a controller for performing a supply state determination which is a determination as to whether the inactive gas is properly supplied based on detected information from the section supply state detecting device, the article storage method comprising the following step that is performed by the controller:

a storage unit managing step in which any of the plurality of sections for which it is determined in the supply state determination that the inactive gas is not properly supplied is designated as a subject section, and in which, if the bypass switching valve provided in the bypass portion communicated to the storage unit feeding portion of the subject section is in the closed state, the storage units belonging to the subject section are managed as disallowed storage units which are not allowed to house the transporting containers, based on detected information from the switched state detecting device.

An example of a preferred embodiment of the present invention is described next.

In an embodiment of the article storage facility in accordance with the present invention, the storage unit feeding portions are preferably divided into groups of two storage unit feeding portions, wherein the bypass portion is preferably configured to allow communication between the two storage unit feeding portions in a same group.

With the above-described arrangement, the configuration of the bypass portion can be simplified compared with a case where a bypass portion is configured to allow communication among three or more storage unit feeding portions.

In an embodiment of the article storage facility in accordance with the present invention, a storage shelf including the storage units arranged in a vertical direction and in a lateral direction is preferably provided wherein the bypass portion is preferably configured to allow communication between the storage unit feeding portions of the sections that are adjacent each other in the vertical direction or in the lateral direction.

With the above-described arrangement, the length of the bypass portion can be shortened compared with a case where the bypass portion is configured to allow communication between the storage unit feeding portions of sections that are spaced apart from each other in the vertical direction or in the lateral direction.

In an embodiment of the article storage facility in accordance with the present invention preferably further comprises: a section supply state detecting device for detecting a supply state of the inactive gas to associated one of the plurality of sections; a switched state detecting device for detecting a switched state of the bypass switching valve; and a controller for performing a supply state determination which is a determination as to whether the inactive gas is properly supplied based on detected information from the section supply state detecting device, wherein the section for which it is determined by the supply state determination that the inactive gas is not properly supplied is preferably designated as a subject section, and wherein, if the bypass switching valve provided in the bypass portion communicated to the storage unit feeding portion of the subject section is in the closed state, the controller is preferably configured to manage the storage units belonging to the subject section as disallowed storage units which are not allowed to house the transporting containers, based on detected information from the switched state detecting device.

With the above-described arrangement, if the amount of the inactive gas supplied to a section decreases to below a proper supply amount or if the inactive gas is not supplied to the section at all due to damage to an inactive gas feed passage or failure of a device, such as a pressure adjusting valve, provided in an inactive gas feed passage, the section supply state detecting device can detect that the inactive gas is not properly supplied to the section (referred to, hereinafter, as a "subject section"). And if the bypass switching valve provided in the bypass portion communicated to the storage unit feeding portion of the subject section is in the closed state, then the storage units belonging to the subject section are managed as disallowed storage units. As such, when storing a transporting container in a storage unit, for example, by not selecting the storage unit to which the inactive gas is not properly supplied as the storage unit in which the transporting container is to be stored, and by selecting the storage unit to which the inactive gas can be properly supplied, the inactive gas is supplied to the transporting container stored in the storage unit; thus, negative effects on the substrates that are stored in the storage units can be prevented from occurring.

In addition, when the bypass switching valve provided in the bypass portion that is communicated to the storage unit feeding portion of the subject section is switched to the open state, the inactive gas can be supplied from the bypass portion to the subject section in question. In this case, since the bypass switching valve is not in the closed state, the storage units belonging to the subject section are not managed as disallowed storage units. Thus, for example, when storing a transporting container in a storage unit, the transporting container can be stored in one of the storage units, that belong to the subject section, but to which the inactive gas is supplied from the bypass portion; thus, the storage units can be utilized efficiently.

In an embodiment of the article storage facility in accordance with the present invention, the controller is preferably configured to perform a retreating transport operation in which a transporting container, that is stored in one of the storage units that is changed to the disallowed storage unit due to a change in a supply state of the inactive gas, is transported to another one of the storage units that is not managed as the disallowed storage unit, based on detected information from the section supply state detecting device.

With the above-described arrangement, even when it becomes impossible to properly supply the inactive gas to a storage unit, the transporting container stored in the storage unit in question can be transported to a storage unit to which the inactive gas can be properly supplied; thus, negative effects on the substrates in the transporting container can be prevented from occurring.

In an embodiment of the article storage method in accordance with the present invention, the steps performed by the controller preferably further comprises a retreating transport operation step in which a transporting container, that is stored in one of the storage units that is changed to the disallowed storage unit due to a change in a supply state of the inactive gas, is transported to another one of the storage units that is not managed as the disallowed storage unit, based on detected information from the section supply state detecting device.

DETAILED DESCRIPTION

Embodiments in which the present invention is applied to an article storage facility having a purge function are described next with reference to the accompanying drawings.
(General Construction)

Figure 1:
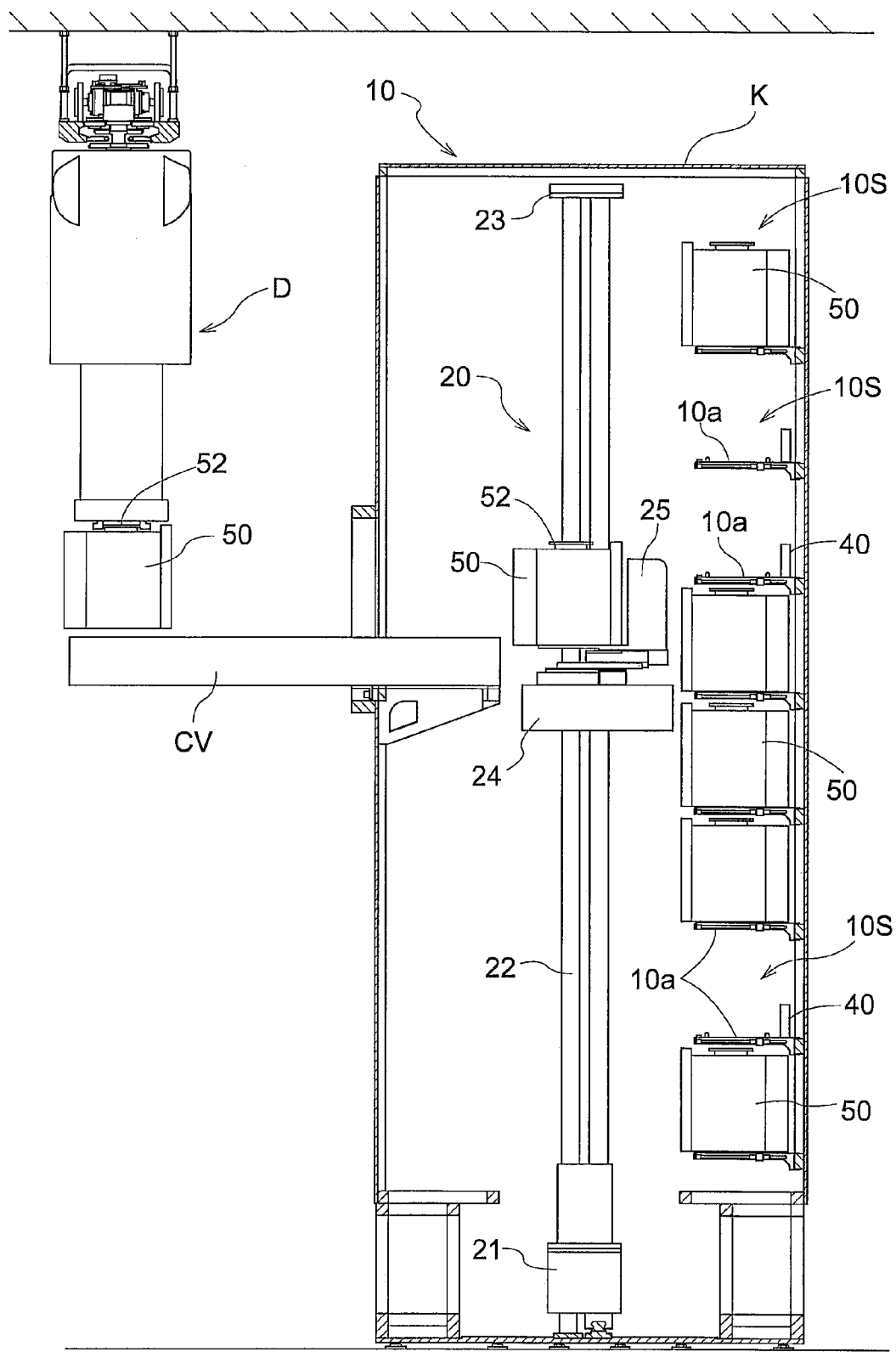
FIG. 1 is a vertical sectional side view of an article storage facility.
Figure 2:
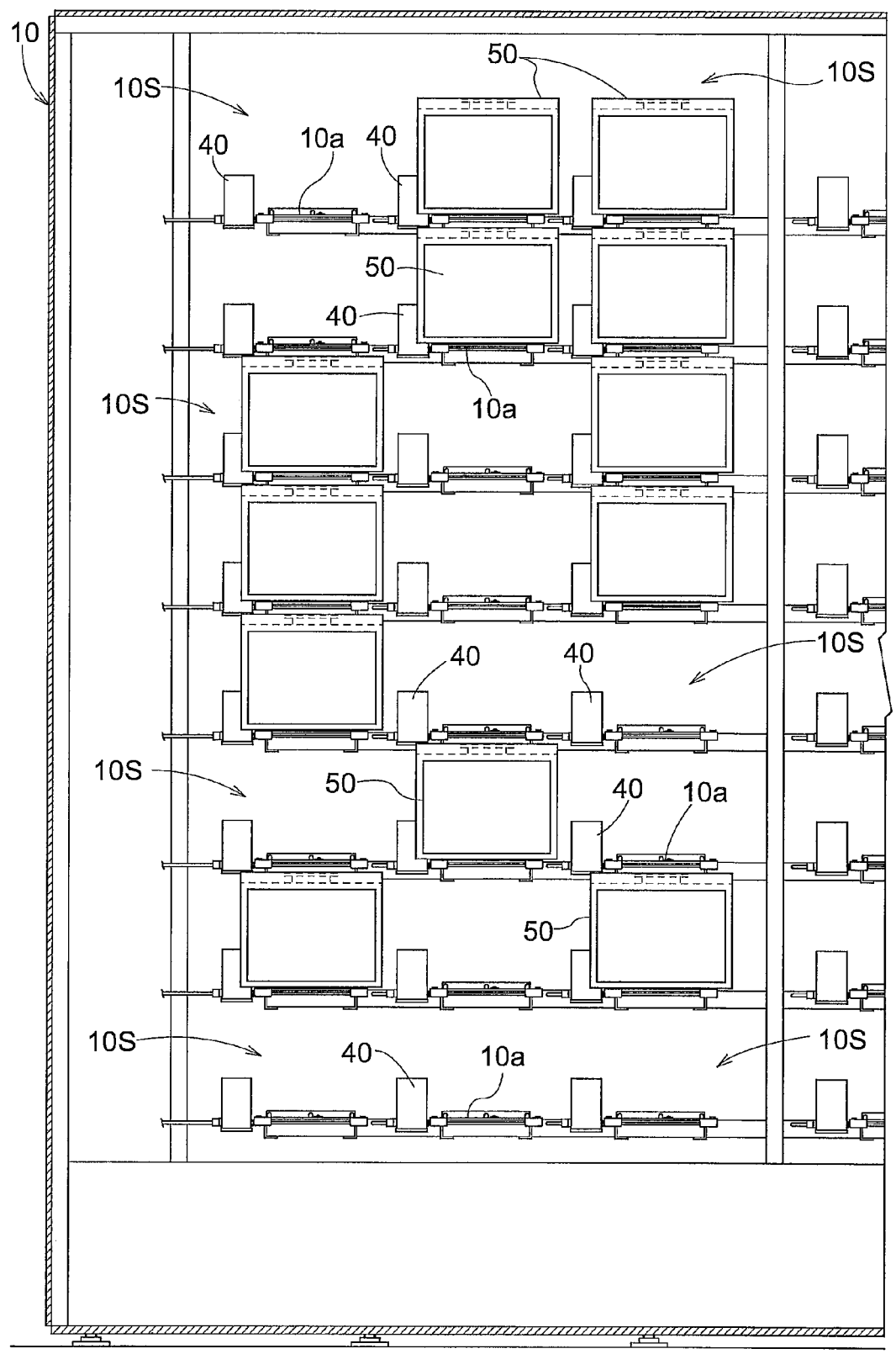
FIG. 2 is a vertical sectional front view showing a part of the facility in FIG. 1.

An article storage facility, as shown in FIG. 1 and FIG. 2, includes a storage shelf 10 having storage units 10S for storing transporting containers 50 (i.e. containers 50 to be transported which are referred to, hereinafter, as containers 50 for short) each accommodating or housing substrates W therein in a sealed state, with the storage units 10S arranged in vertical columns and lateral rows, and a stacker crane 20 as a transport device for transporting the containers 50 to and from the plurality of storage units 10S and to and from the carry in and out conveyor CV. In the present embodiment, a substrate W is a semiconductor wafer, and each container 50 to be stored is a FOUP (Front Opening Unified Pod) which accommodates or houses the semiconductor wafers.
(Construction of Container 50)

Figure 4:
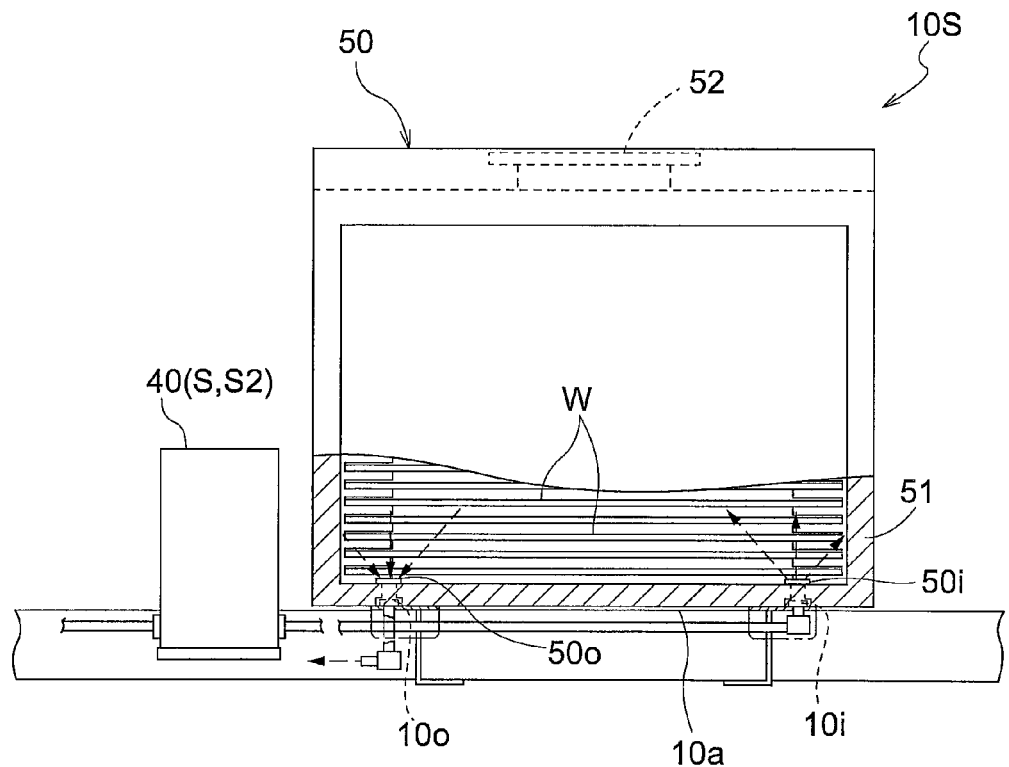
FIG. 4 is a front view of the storage unit with a container placed thereon.

As shown in FIG. 4, each container 50 includes a casing 51 having an opening for taking the substrates W in and out of the container 50, and a detachable lid (not shown) for closing the opening of the casing 51.

As shown in FIGS. 1, 2, and 4, a top flange 52, which can be gripped by a hoist type transport carriage D, is formed in the upper face of the container 50. A gas feed opening 50i for introducing nitrogen gas as an inactive gas and a gas discharge opening 50o are provided in the bottom of the container 50. Though not shown, an introducing side opening and closing valve is provided at the gas feed opening 50i whereas a discharging side opening and closing valve is provided at the gas discharge opening 50o.

In other words, the container 50 accommodates the substrates W in a sealed state by virtue of the fact that the opening is closed by the lid, and each of the opening and closing valve at the gas feed opening 50i and the one at the gas discharge opening 50o is closed while the substrates W are accommodated or housed within the container 50.

The introducing side opening and closing valve is urged in its closing direction, or toward its closed position, by means of an urging member such as a spring. And when the discharge pressure of nitrogen gas fed to the gas feed opening 50i becomes higher than a set valve opening pressure which is higher than the atmospheric pressure by a set value, the introducing side opening and closing valve is opened by this pressure.

Further, the discharging side opening and closing valve is urged by the urging member such as a spring in the closing direction or toward its closed position, so that when the pressure inside the container 50 reaches a pressure higher than a set valve opening pressure which is higher than the atmospheric pressure by a set value, the valve is opened by this pressure.
(Construction of Stacker Crane 20)

As shown in FIG. 1, the stacker crane 20 includes a traveling carriage 21 which can run or travel along a travel rail installed on the floor on the side of the front face of the storage shelf 10, a mast 22 mounted erect on the traveling carriage 21, upper frame 23 which is provided in an upper end of the mast 22 and which engages an upper guide rail (not shown), and a lift deck 24 which can be moved up and down, or raised or lowered, as being guided by the mast 22.

A transfer device 25 for transferring the container 50 to or from the storage unit 10S is mounted on the lift deck 24.

The stacker crane 20 is configured to perform a carry-in operation for transporting a container 50 on the carry in and out conveyer CV to the storage unit 10S, a carry-out operation for transporting the container 50 stored in the storage unit 10S to the carry in and out conveyer CV, and a relocating operation for transporting a container 50 in the storage unit 10S to another storage unit 10S, by performing the traveling operation of the traveling carriage 21, the raising and lowering operation of the lift deck 24 and the transfer operation of the transfer device 25.
(Construction of Storage Section 10S)

Figure 6:
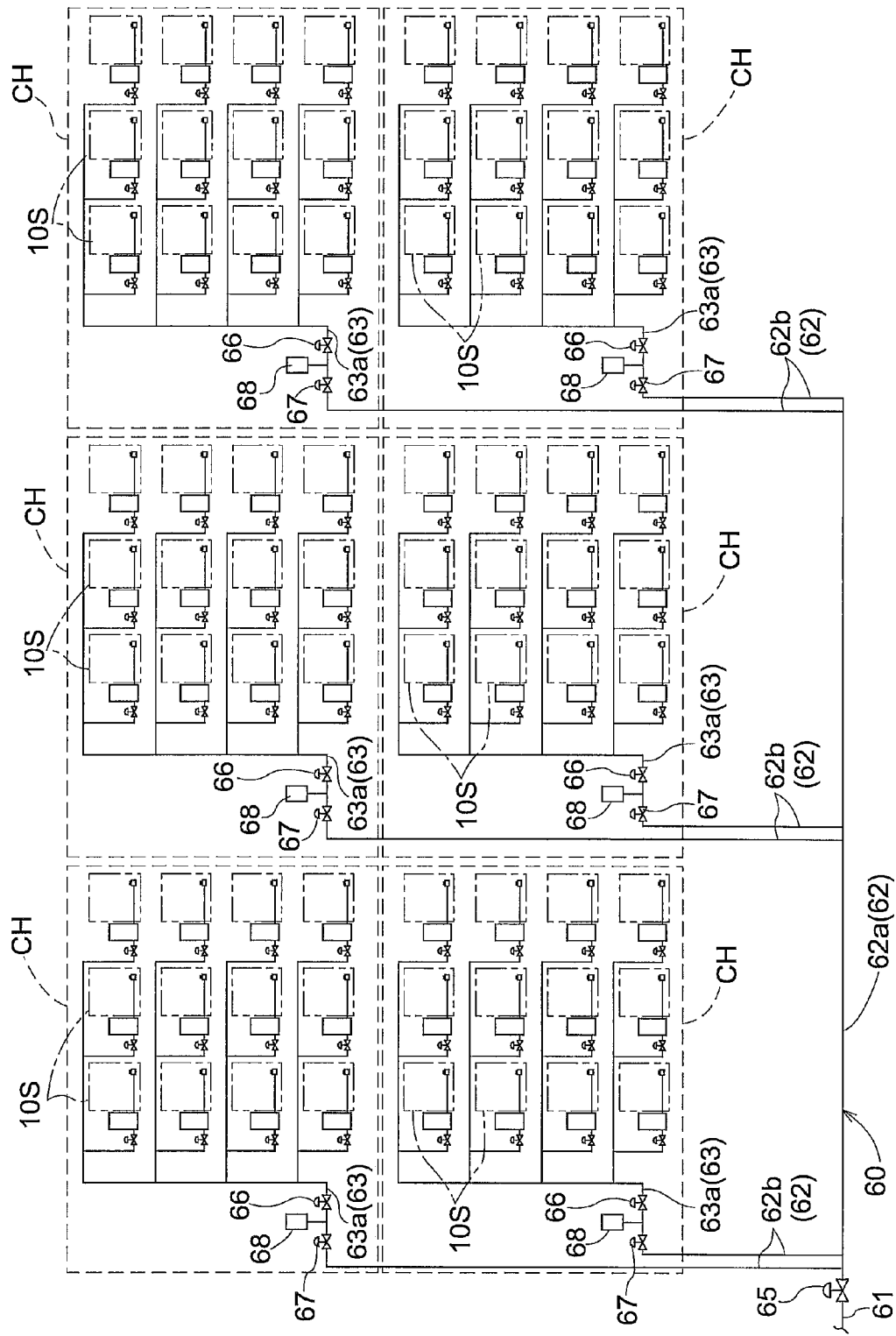
FIG. 6 shows how inactive gas is supplied to different sections.

As shown in FIG. 2, in the storage shelf 10, multiple horizontal rows (eight layers in the present example) of storage units 10S are arranged or layered in the vertical direction whereas multiple vertical columns (nine columns in the present example although FIG. 2 shows only four columns) of storage units 10S are arranged or layered in the lateral direction; thus, there are storage units 10S located at 72 locations in the entire storage shelf 10. And as shown in FIG. 6, the 72 storage units 10S is divided into six sections CH such that each of the 72 storage units 10S belongs to one of the six sections CH, with each section CH consisting of the total of 12 storage units 10S defined by four horizontal rows of storage units 10S arranged or layered in the vertical direction and three vertical columns of the storage units 10S arranged or layered in the lateral direction. Thus, the plurality of storage units 10S in the storage shelf 10 are divided into a plurality of sections CH.

Figure 3:
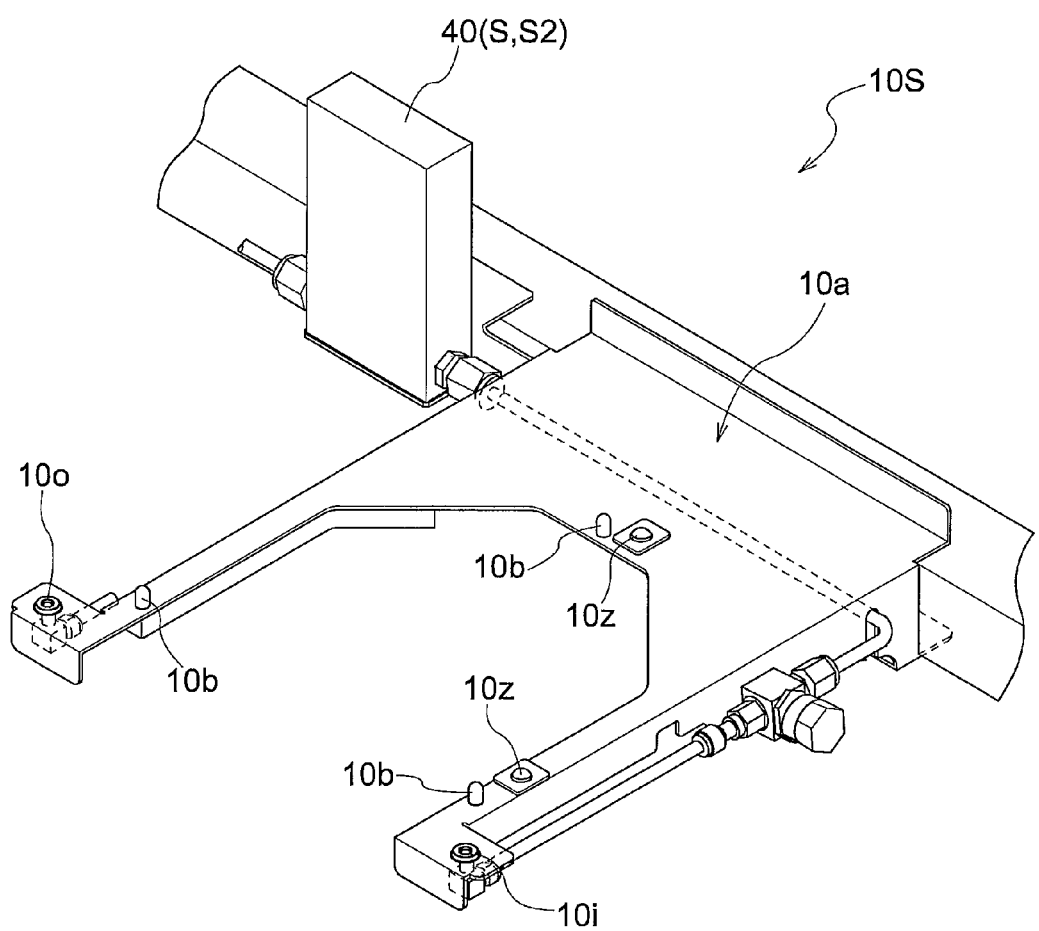
FIG. 3 is a perspective view of a storage unit.

As shown in FIG. 3, each of the plurality of storage units 10S includes a receiving support portion 10a for receiving and supporting the container 50 thereon. And each storage unit 10S stores a container 50 with the container 50 received and supported by the receiving support portion 10a.

In addition, the receiving support portion 10a includes three positioning projections 10b which engage engaged portions (not shown) formed in the undersurface of the container 50 for positioning the container 50 at a predetermined position and a pair of container sensors 10z for detecting whether the container 50 is placed on the receiving support portion 10a (that is, whether a container 50 is stored in the storage unit 10S).

Figure 5:
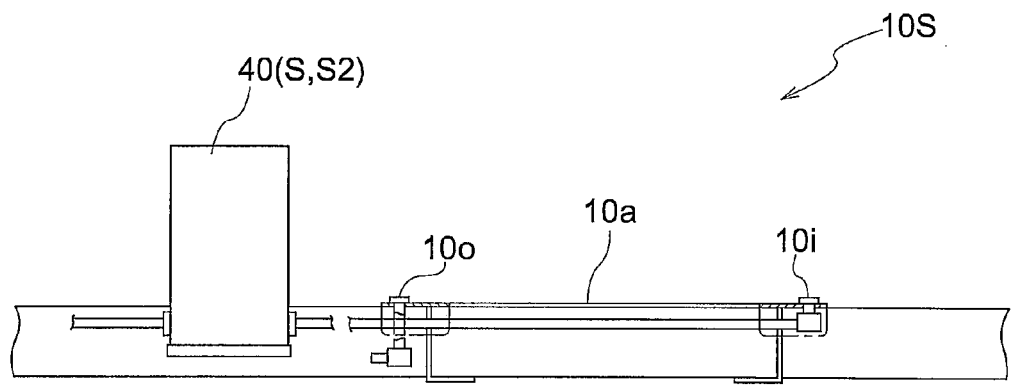
FIG. 5 is a front view of the storage unit without a container placed thereon.

In addition, as shown in FIGS. 3 and 5, the receiving support portion 10a further includes a discharge nozzle 10i for feeding nitrogen gas as an inactive gas into the container 50 stored in a storage unit 10S and a discharging gas passage body 10o which allows a gas discharged from inside the container 50 to pass.

As shown in FIG. 4, the discharge nozzle 10i is so located that the discharge nozzle 10i fits into a gas feed opening 50i provided in the undersurface of the container 50 when the container 50 is placed at the predetermined position on the receiving support portion 10a. In addition, the discharging gas passage body 10o is so located that the discharging gas passage body 10o fits into a gas discharge opening 50o provided in the undersurface of the container 50 when the container 50 is placed at the predetermined position on the receiving support portion 10a.

Thus, when the container 50 is stored in the storage unit 10S and received and supported on the receiving support portion 10a, the container 50 is positioned in a proper position by the positioning projections 10b so that the discharge nozzle 10i is fit into and connected to the gas feed opening 50i of the container 50 while the discharging gas passage body 10o is fit into and connected to the gas discharge opening 50o.

And with the container 50 received and supported on the receiving support portion 10a, the nitrogen gas is introduced to inside the container 50 through the gas feed opening 50i of the container 50 by discharging the nitrogen gas from the discharge nozzle 10i at a pressure higher than the atmospheric pressure by a set value to discharge or remove the gas that is present within the container 50 to the outside through the gas discharge opening 50o.

(Construction for Supplying Nitrogen Gas)

Figure 7:
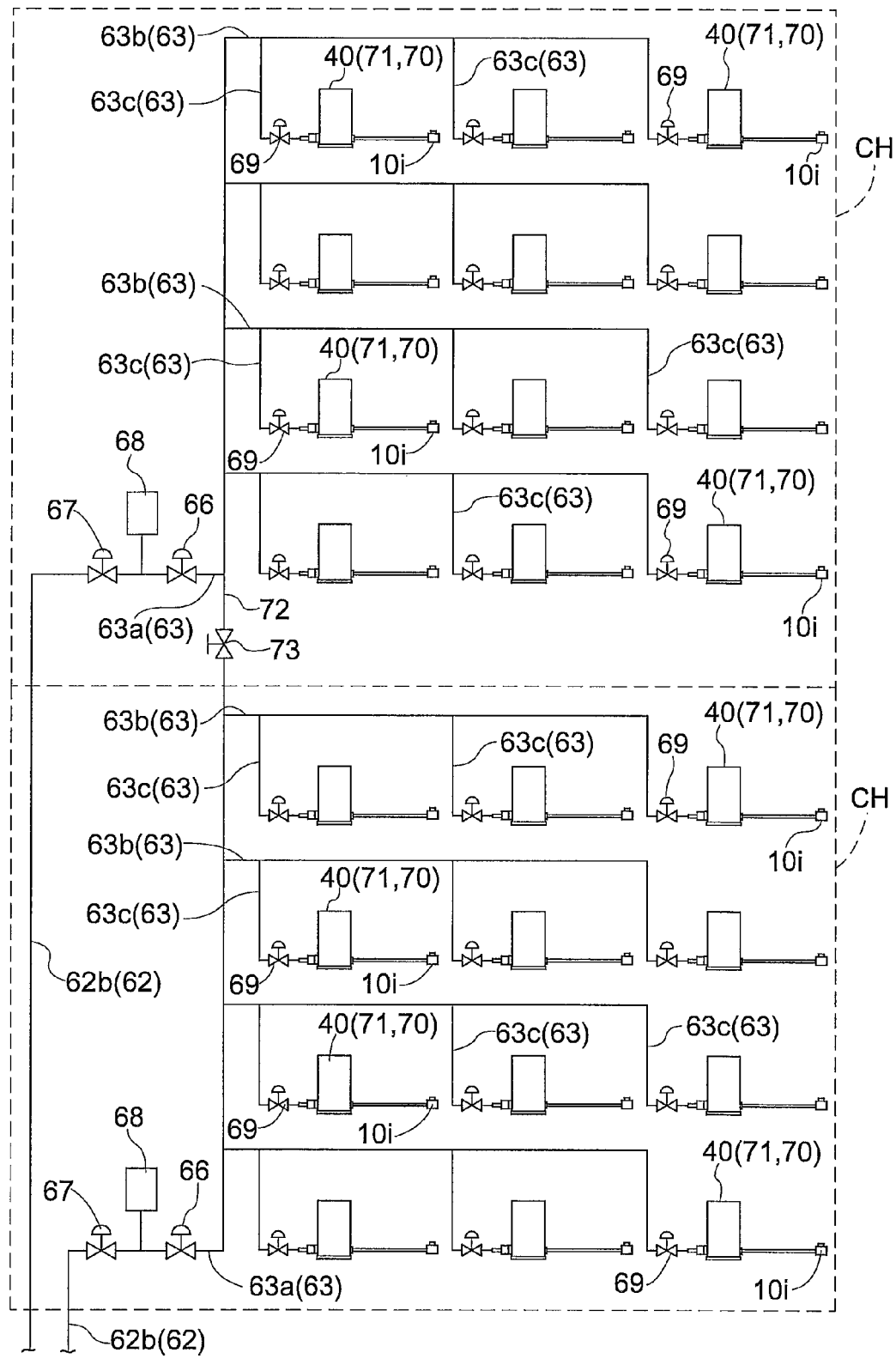
FIG. 7 shows how the inactive gas is supplied to different storage units.

As shown in FIGS. 6 and 7, the article storage facility is provided with nitrogen gas feed passages 60 as inactive gas feed passages for supplying nitrogen gas to the plurality of storage units 10S. This nitrogen gas feed passages 60 are described next. FIG. 6 shows the structure for supplying nitrogen gas to each section CH whereas FIG. 7 shows the structure for supplying nitrogen gas to each storage unit 10S. Note that only two sections CH that are adjacent each other in the vertical direction are shown in FIG. 7.

As shown in FIGS. 6 and 7, the nitrogen gas feed passages 60 include a main feed portion 61, section feeding portions 62 each of which diverts the nitrogen gas supplied by the main feed portion 61 and supplies it to each of the plurality of sections CH, storage unit feeding portions 63 each of which diverts the nitrogen gas supplied to the respective section CH by the section feeding portion 62 and supplies it to each of the plurality of storage units 10S in the section CH.

As shown in FIG. 6, the section feeding portion 62 includes an upstream section feeding portion 62a connected to the main feed portion 61, and a plurality of downstream section feeding portions 62b which branch or break off from the upstream section feeding portion 62a. Six (which is the number of the sections CH) of downstream section feeding portions 62b are connected to the upstream section feeding portion 62a.

Note that the same size pipe (i.e. same diameter pipe) as the main feed portion 61 is used for the upstream section feeding portion 62a whereas smaller size pipes (i.e. pipes with a smaller diameter) than the upstream section feeding portion 62a are used for the downstream section feeding portions 62b.

Six of the storage unit feeding portions 63 are provided to match the number of the sections CH. As shown in FIG. 7, each of the storage unit feeding portions 63 includes an upstream storage unit feeding portion 63a which is connected to the section feeding portion 62, midstream storage unit feeding portions 63b which branch or break off from the upstream storage unit feeding portion 63a, and downstream storage unit feeding portions 63c which branch or break off from each midstream storage unit feeding portion 63b. Four (which is the same as the number of rows of the storage units 10S in the section CH) of the midstream storage unit feeding portions 63b are connected to each upstream storage unit feeding portion 63a whereas three (which is the same as the number of columns of the storage units 10S in the section CH) of the downstream storage unit feeding portions 63c are connected to each midstream storage unit feeding portion 63b.

Note that the same size pipes as (i.e. pipes with the same diameter as) the downstream section feeding portion 62b are used for the upstream storage unit feeding portion 63a and for the midstream storage unit feeding portions 63b whereas smaller size pipes (i.e. pipes with smaller diameter) are used for the downstream storage unit feeding portions 63c than the upstream storage unit feeding portion 63a and the midstream storage unit feeding portions 63b.

As shown in FIG. 6, a main valve 65, which can be switched between an open state in which nitrogen gas can communicate, or flow, from the main feed portion 61 to the section feeding portion 62 and a closed state in which the nitrogen gas cannot communicate from the main feed portion 61 to the section feeding portion 62, is provided at the connection between the main feed portion 61 and the section feeding portion 62. The state of gas supply for each storage shelf 10 can be switched by operating this main valve 65 between a state in which nitrogen gas is supplied to the storage shelf 10 and a state in which nitrogen gas is not supplied to the storage shelf 10.

As shown in FIGS. 6 and 7, provided at each of the connections between the section feeding portion 62 and the plurality of storage unit feeding portions 63 are a section valve 66 which is a valve associated with the section and which can be switched between an open state in which nitrogen gas can communicate from the section feeding portion 62 to the storage unit feeding portion 63 and a closed state in which nitrogen gas cannot communicate from the section feeding portion 62 to the storage unit feeding portion 63, a pressure adjusting valve 67 which functions as a pressure adjusting device for adjusting the pressure of the nitrogen gas in the storage unit feeding portion 63 by adjusting the flow rate of the nitrogen gas communicated from the section feeding portion 62 to the storage unit feeding portion 63, a pressure sensor 68 which functions as a pressure detection device for detecting the pressure of the nitrogen gas in the storage unit feeding portion 63. The state of gas supply for each section CH can be switched by operating this section valve 66 between a state in which nitrogen gas is supplied to the section CH and a state in which nitrogen gas is not supplied to the section CH.

As shown in FIG. 7, provided at each of the connections between the storage unit feeding portion 63 and the discharge nozzles 10i are a mass flow controller 40 and a storage unit valve 69 which is a valve for storage unit and which can be switched between an open state in which the nitrogen gas can communicate from the storage unit feeding portion 63 to the discharge nozzle 10i and a closed state in which the nitrogen gas cannot communicate from the storage unit feeding portion 63 to the discharge nozzle 10i. The state of gas supply for each storage unit 10S can be switched by operating the storage unit valve 69 between a state in which nitrogen gas is supplied to the storage unit 10S and a state in which nitrogen gas is not supplied to the storage unit 10S.

As shown only with reference numerals in FIG. 7, each mass flow controller 40 includes a flow rate adjusting valve 70 for adjusting the flow rate of the nitrogen gas supplied from the storage unit feeding portion 63 to the discharge nozzle 10i, and a flow rate sensor 71 for detecting the flow rate of the nitrogen gas communicated from the storage unit feeding portion 63 to the discharge nozzle 10i. In other words, each mass flow controller 40 (flow rate adjusting valve 70) functions as a feed rate adjusting device for adjusting the flow rate of the nitrogen gas supplied to the discharge nozzle 10i.

As shown in FIG. 7, the plurality of storage unit feeding portions 63 are divided into groups of two storage unit feeding portions 63 in the present embodiment. And a bypass portion 72 is provided to allow communication between the two storage unit feeding portions 63 in the same group. Incidentally, the bypass portions 72 are not shown in FIG. 6.

In the present embodiment, each bypass portion 72 is positioned to allow communication between two storage unit feeding portions 63 that belong to two sections CH that are adjacent each other in the vertical direction, with the total of three bypass portions 72 provided in the six sections CH.

In addition, provided in each bypass portion 72 is a bypass switching valve 73 which is a valve for the bypass and which can be switched between an open state in which the nitrogen gas can flow in the bypass portion 72 and a closed state in which the nitrogen gas cannot flow in the bypass portion 72. The bypass switching valves 73 are usually switched to the closed state. Thus, the bypass switching valves 73 are in their closed state in the following description unless specifically stated otherwise.

Note that the same size pipe as the upstream storage unit feeding portion 63a, etc., is used for each bypass portions 72.

(Control Arrangement)

Figure 8:
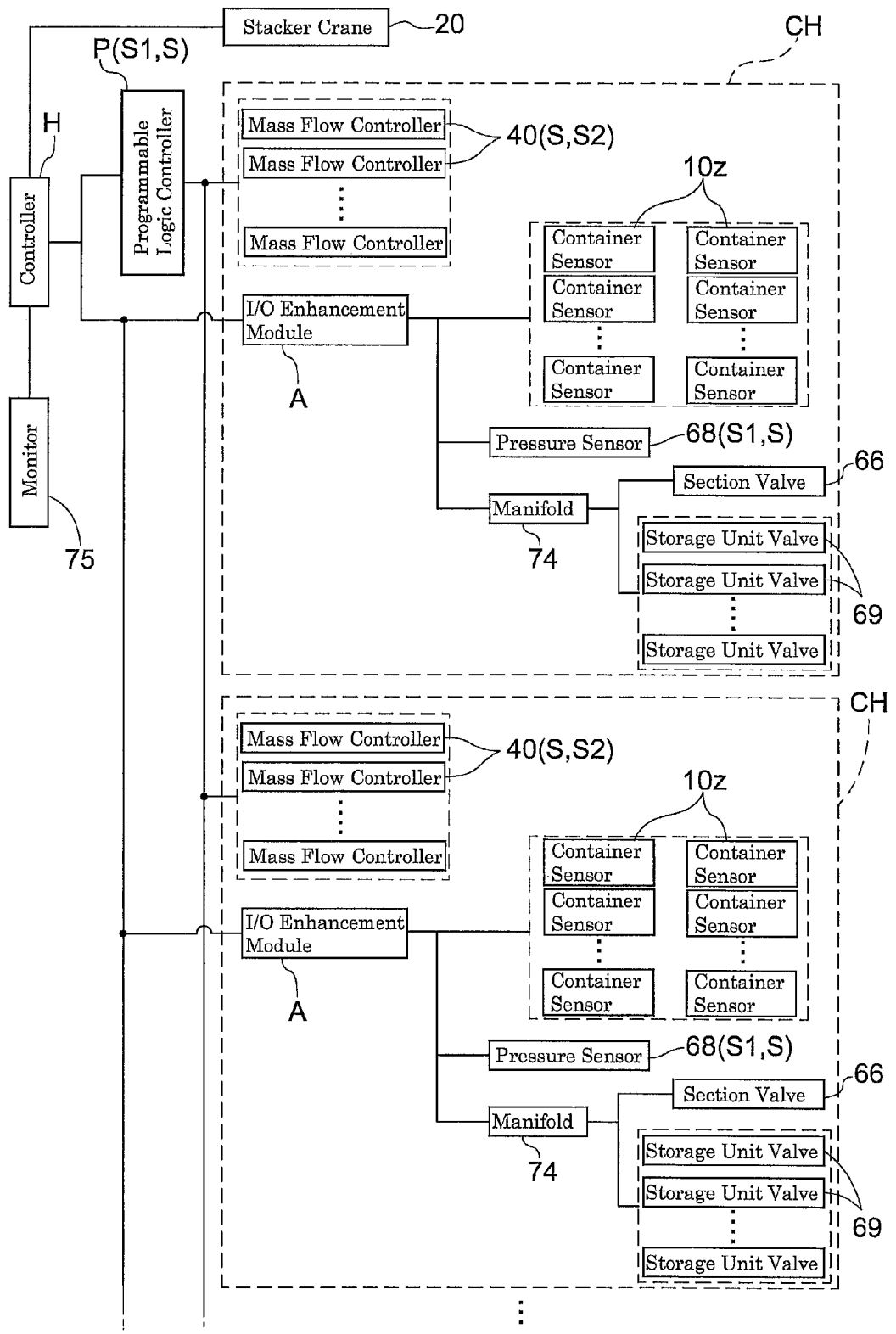
FIG. 8 is a control block diagram.

As shown in FIG. 8, a controller H is configured to manage, among other things, the storage status (which includes locations) of the containers 50 in the storage shelf 10 as well as to control operation of the stacker crane 20 based on a carry-in command and carry-out command from a superordinate controller (not shown).

To describe in more detail, when a carry-in command is issued from the superordinate controller, the controller H performs a carry-in transport process in which the controller H selects, based on the storage status, an empty storage unit 10S, in which no container 50 is stored, as the target storage unit 10S in which a container 50 is to be stored, and in which the controller H controls the operation of the stacker crane 20 to transport the container 50 from the carry in and out conveyor CV to the target storage unit 10S. In addition, when a carry-out command is issued from the superordinate controller, the controller H is configured to perform a carry-out transport process in which the controller H controls, based on the storage status, the operation of the stacker crane 20 to transport the container 50 from the storage unit 10S, in which the container 50 to be carried or taken out is stored, to the carry in and out conveyor CV.

The controller H is configured to transmit, to the programmable logic controller P, feed information which indicates the amount of nitrogen gas to be supplied or fed as well as the storage unit or units 10S to which the nitrogen gas is to be supplied, and to control the operations of the section valves 66, the storage unit valves 69, and the flow rate adjusting valves 70 (mass flow controller 40). The control construction for controlling the operations of the section valves 66, the storage unit valves 69, and the flow rate adjusting valves 70 is described next.

In present embodiment, the pressure adjusting valves 67 and the bypass switching valves 73 are configured to be operated by hand.

The programmable logic controller P and I/O enhancement modules A are connected to the controller H by communication lines for communication.

The mass flow controllers 40 for the six sections are connected to the programmable logic controller P. Since 12 mass flow controllers 40 belong to one section CH, the total of 72 mass flow controllers 40 are connected to the programmable logic controller P in the present embodiment.

One I/O enhancement module A is provided to each of the plurality of sections CH, thus, six modules A are provided, which is the same as the number of the sections CH. Connected to each I/O enhancement module A are the container sensors 10z, the pressure sensors 68, and a manifold 74 that belong to the section CH that is associated with the I/O enhancement module A.

Two container sensors 10z are provided to each storage unit 10S as described above; thus, a total of 24 container sensors 10z are provided to each section CH. These 24 container sensors 10z are connected to the I/O enhancement module A.

In addition, the pressure sensor 68 and the manifold 74 are provided to each of the plurality of sections CH so that one pressure sensor 68 and one manifold 74 are associated with each section CH and are connected to the I/O enhancement module A of each section CH. Incidentally, the manifold 74 is configured to be able to open and close the one section valve 66 and 12 storage unit valves 69 that belong to the associated section CH.

And the programmable logic controller P is configured to transmit command information to the manifold 74 through the I/O enhancement module A based on the feed information from the controller H. The manifold 74 is configured to operate, based on the command information, to supply nitrogen gas to the storage unit 10S to which the nitrogen gas is to be supplied. In other words, the controller H performs a flow rate adjusting step in which the controller H controls the operation of the manifold 74 and switching of the storage unit valve 69, through the I/O enhancement module A.

In addition, the programmable logic controller P is configured to transmit command information to the mass flow controller 40 based on the feed information from the controller H. Each mass flow controller 40 is configured to adjust the flow rate of the nitrogen gas discharged from the discharge nozzle 10i by operating the flow rate adjusting valve 70 to achieve the flow rate that is in line, or in accordance, with the command information.

Each mass flow controller 40 is configured to output an abnormal flow condition signal to the programmable logic controller P if and when a state, in which the flow rate detected by the flow rate sensor 71 does not reach the flow rate that is in line with the command information, continues for a set period of time, due, for example, to an abnormal condition that occurred in the flow rate adjusting valve 70. The abnormal flow condition signal is transmitted from the programmable logic controller P to the controller H.

Note that the mass flow controller 40 functions as an abnormal flow condition detecting device for detecting an abnormal condition of the flow rate adjusting valve 70 (mass flow controller 40), as a storage unit supply state detecting device S2 for detecting the supply state of nitrogen gas to each of the plurality of storage units 10S, and as a supply state detecting device S for detecting the supply state of nitrogen gas to the plurality of storage units 10S.

Each I/O enhancement module A is configured to output a reply signal in response to command information from the programmable logic controller P. The programmable logic controller P is configured to transmit an abnormal I/O condition signal to the controller H when there is no reply signal from an I/O enhancement module A in response to command information.

Note that the programmable logic controller P functions as a relay failure detection device for detecting an abnormal condition in the I/O enhancement module A, and as a section supply state detecting device S1 for detecting the supply state of nitrogen gas to each of the plurality of sections CH, and further as a supply state detecting device S for detecting the supply state of nitrogen gas to the plurality of storage units 10S.

Each manifold 74 is configured to output a reply signal in response to command information from the programmable logic controller P. The programmable logic controller P is configured to transmit an abnormal flow rate condition signal to the controller H when there is no reply signal from an manifold 74 in response to command information.

Note that a flow rate adjusting device consists of and is defined by the manifold 74 and the storage unit valves 69, and that each I/O enhancement module A functions as a relaying device for relaying communication between the controller H and the plurality of flow rate adjusting devices belonging to the associated section CH.

The pressure sensor 68 is configured to output detected information to the programmable logic controller P. The programmable logic controller P is configured to transmit an abnormal pressure signal to the controller H if the pressure detected by the pressure sensor 68 deviates from the pressure in line with, or in accordance with, the command information by a value greater than or equal to a set pressure, that is, if a pressure that is abnormal with respect to the pressure that has been adjusted by the pressure adjusting valve 67 is detected by the pressure sensor 68.

Note that the pressure sensor 68 functions as the section supply state detecting device S1 for detecting the supply state of nitrogen gas to each of the plurality of sections CH, and as the supply state detecting device S for detecting the supply state of nitrogen gas to the plurality of storage units 10S.

The controller H performs a storage unit managing step based on the detected information from the supply state detecting device S. A supply state determination, which is a determination as to whether nitrogen gas is properly supplied, is performed in the storage unit managing step. And the plurality of storage units 10S are managed by distinguishing disallowed storage units, which are the storage units 10S for which it is determined that the nitrogen gas is not properly supplied, from allowed storage units 10S which are the storage units that are not disallowed storage units. That is, the controller H manages the plurality of storage units 10S by distinguishing allowed storage units, which are the storage units 10S to which nitrogen gas is properly supplied, from disallowed storage units 10S to which the nitrogen gas is not properly supplied. And the controller H performs a retreating transport operation step if and when a container 50 is stored in a storage unit 10S that is changed from an allowed storage unit to a disallowed storage unit due to changes in the supply state of nitrogen gas. In the retreating transport operation step, a retreating transport operation is performed in which the container 50, that is stored in the storage unit 10S that is changed from an allowed storage unit to a disallowed storage unit due to changes in the supply state of the nitrogen gas, is transported to a storage unit 10S that is managed as an allowed storage unit.

Figure 9:
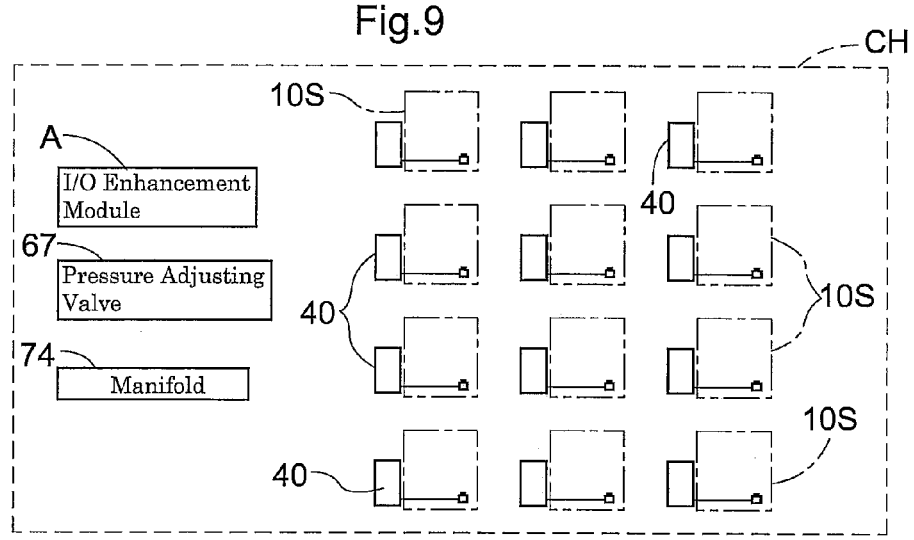
FIG. 9 shows an example of a control status of the storage units by a controller.
Figure 10:
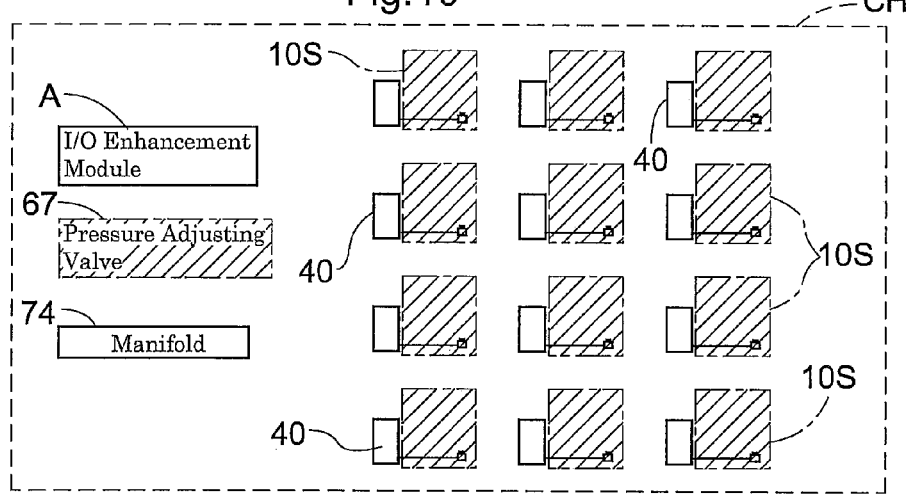
FIG. 10 shows another example of a control status of the storage units by the controller.
Figure 11:
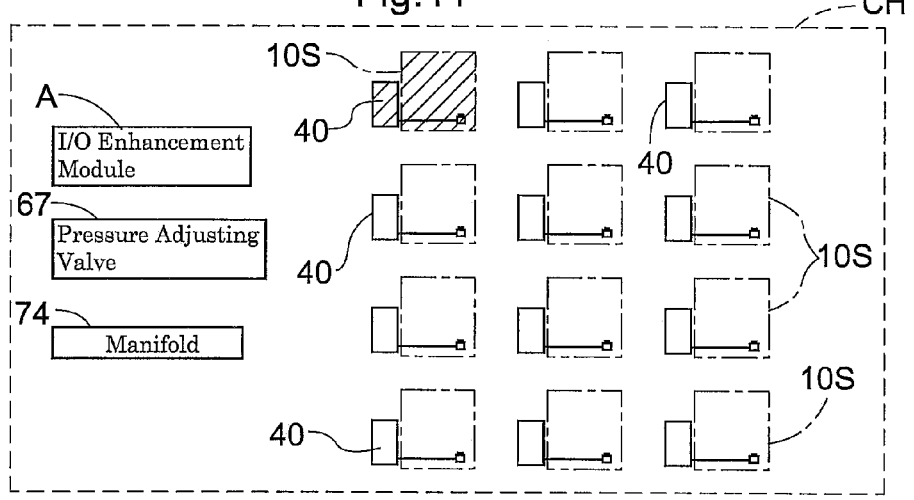
FIG. 11 shows yet another example of a control status of the storage units by the controller.

How the controller H manages the plurality of storage units 10S is described further. FIG. 9 shows a section CH in which the nitrogen gas is properly supplied to all of the storage units 10S that belong to the section CH. FIG. 10 shows a section CH in which the nitrogen gas is not properly supplied to all of the storage units 10S that belong to the section CH. FIG. 11 shows a section CH in which the nitrogen gas is not properly supplied to some of the storage units 10S that belong to the section CH. In FIGS. 10 and 11, the apparatus in which failure occurred (pressure adjusting valve 67 in FIG. 10) and the storage unit 10S managed as a disallowed storage unit are shaded.

If and when a pressure that is abnormal with respect to the pressure that has been adjusted by the pressure adjusting valve 67 is detected by the pressure sensor 68 and an abnormal pressure signal is transmitted from the programmable logic controller P, the controller H is configured to manage and designate all of the storage units 10S, belonging to the section CH associated with the section feeding portion 62 in which the abnormal pressure was detected, as disallowed storage units (see FIG. 10). In other words, the controller H makes a determination as the supply state determination based on the detected information from the pressure sensor 68 as to whether an abnormal pressure, with respect to the pressure that has been adjusted by the pressure adjusting valve 67, is detected by the pressure sensor 68. The controller H determines that abnormal pressure is detected by the pressure sensor 68 if the abnormal pressure signal is transmitted from the programmable logic controller P, and determines the section CH associated with the pressure sensor 68 to be a section CH in which the nitrogen gas is not properly supplied. The controller H determines all of the storage units 10S, belonging to the section CH that is determined to be a section in which the nitrogen gas is not properly supplied (referred to, hereinafter, as the "subject section"), to be storage units 10S to which the nitrogen gas is not properly supplied, and manages them as disallowed storage units.

If and when an abnormal condition of an I/O enhancement module A is detected and an abnormal I/O condition signal is transmitted from the programmable logic controller P, the controller H is configured to manage all of the storage units 10S belonging to the section CH associated with the I/O enhancement module A as disallowed storage units. In other words, the controller H makes a determination as the supply state determination based on the detected information from the programmable logic controller P as to whether the abnormal condition in an I/O enhancement module A is detected by the programmable logic controller P. The controller H determines that an abnormal condition of an I/O enhancement module A is detected if the abnormal I/O condition signal is transmitted from the programmable logic controller P, and determines that the section CH associated with the I/O enhancement module A is a subject section. The controller H determines all of the storage units 10S belonging to the subject section to be storage units 10S to which the nitrogen gas is not properly supplied and manages them as disallowed storage units.

If and when an abnormal condition of the manifold 74 is detected and an abnormal flow rate signal is transmitted from the programmable logic controller P, the controller H is configured to manage all of the storage units 10S belonging to the section CH associated with the manifold 74 as disallowed storage units. In other words, the controller H makes a determination as the supply state determination based on the detected information from the programmable logic controller P as to whether an abnormal condition of the manifold 74 is detected by the programmable logic controller P. The controller H determines that an abnormal condition of the manifold 74 is detected if the abnormal flow rate signal is transmitted from the programmable logic controller P, and determines that the section CH associated with the manifold 74 is a subject section. The controller H determines that all of the storage units 10S belonging to the subject section are storage units 10S to which the nitrogen gas is not properly supplied, and manages them as disallowed storage units.

If and when an abnormal condition of a mass flow controller 40 is detected and an abnormal flow condition signal is transmitted from the programmable logic controller P, the controller H is configured to manage the storage unit 10S, to which the nitrogen gas is supplied through the mass flow controller 40, as a disallowed storage unit (see FIG. 11). In other words, the controller H makes a determination as the supply state determination based on the detected information from the mass flow controller 40 as to whether an abnormal condition of the flow rate adjusting valve 70 is detected by the mass flow controller 40. The controller H determines that an abnormal condition of the flow rate adjusting valve 70 (mass flow controller 40) is detected if an abnormal flow condition signal is transmitted from the programmable logic controller P. The controller H determines the storage unit 10S, to which the nitrogen gas is supplied through the mass flow controller 40, to be a storage unit 10S to which the nitrogen gas is not properly supplied, and manages it as a disallowed storage unit.

As such, the controller H is configured to manage all of the storage units 10S, belonging to the section CH (subject section) for which it is determined that the nitrogen gas is not properly supplied, as disallowed storage units based on the detected information from the section supply state detecting device S1, and is also configured to manage the storage unit 10S, for which it is determined that the nitrogen gas is not properly supplied, as a disallowed storage unit based on the detected information from the storage unit supply state detecting device S2. And the controller H is configured to manage the storage units 10S that are not managed or designated as disallowed storage units as allowed storage units.

The retreating transport operation performed by the controller H is described next.

Figure 14:
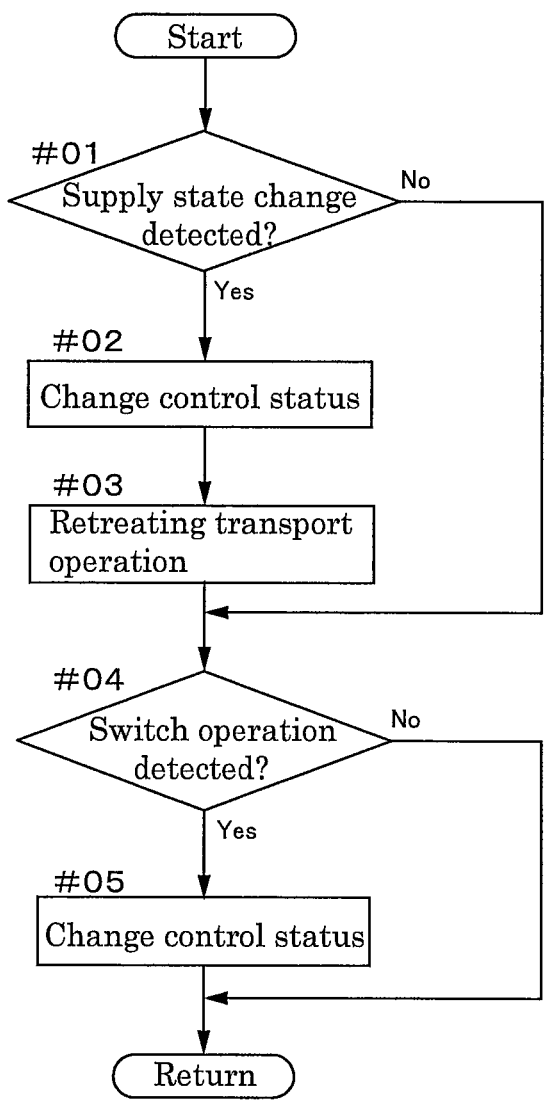
FIG. 14 is a flow chart.

As shown in FIG. 14, if any changes in the supply state of the inactive gas to any one of the plurality of storage units 10S are detected by the supply state detecting device S (i.e., "Yes" in Step #01), the controller H is configured to change the control status of the storage unit 10S based on the change (Step #02). More specifically, if an abnormal condition signal, which is any one of the abnormal pressure signal, the abnormal flow condition signal, the abnormal flow rate signal and the abnormal I/O condition signal, is transmitted regarding any of the storage units 10S that are managed as allowed storage units, the controller H is configured to change the control status of the storage unit 10S to a disallowed storage unit. And the controller H is configured to change the control status of the storage unit 10S to the allowed storage unit if any of the abnormal condition signals is no longer transmitted regarding the storage unit 10S that is managed as a disallowed storage unit.

And if a container 50 is stored in a storage unit 10S whose control status has been changed from the allowed storage unit to the disallowed storage unit due to changes in the supply state of the nitrogen gas, the controller H performs the retreating transport operation based on the storage status to transport the container 50 to a storage unit 10S that is managed as an allowed storage unit (step #03).

Incidentally, the controller H is configured not to select any of the storage units 10S that are managed as disallowed storage units as the storage unit 10S to which a container 50 is to be brought in when performing a carry-in transport process, so as not to store any containers 50 in any of the storage units 10S that are managed as disallowed storage units.

More specifically, for example, when all of the storage units 10S belonging to a certain section CH are managed as allowed storage units as shown in FIG. 9, and when abnormal pressure is detected by the pressure sensor 68 because the pressure adjusting valve 67 failed and the abnormal pressure signal is transmitted to the controller H, then, as shown in FIG. 10, all of the storage units 10S belonging to the section CH will be managed as disallowed storage units. In such a case, all of the containers 50 stored in the storage units 10S belonging to the section CH in question are transported to the storage units 10S that are managed as allowed storage units in one or more of other sections CH.

Thus, by performing the retreating transport operation to transport the containers 50 to the storage units 10S that are managed as allowed storage units, inactive gas can be properly fed or supplied to the containers 50 because the inactive gas is properly supplied to these storage units 10S. Thus, negative effects on the substrates W in the containers 50 stored by the storage units 10S can be prevented from occurring even when it becomes impossible to properly supply inactive gas to the storage unit 10S.

And in the present embodiment, when transporting all of the containers 50, stored in the storage units 10S belonging to the section CH in question, to one or more of other sections CH by the retreating transport operation, if there are storage units 10S (in the section H in question) for which it is detected by the storage unit supply state detecting device S2 that the nitrogen gas is not properly supplied as well as storage units 10S for which it is detected by the storage unit supply state detecting device S2 that the nitrogen gas is properly supplied, then the containers 50 stored in the former storage units 10S to which the nitrogen gas is not properly supplied are preferentially transported to the storage units 10S managed as allowed storage units. Here, the "former" storage units 10S are the storage units 10S for which it is determined that the nitrogen gas is not properly supplied by the supply state determination based on the detected information from the storage unit supply state detecting device S2 and the "latter" storage units 10S are the rest of the storage units 10S that are not the "former" storage units 10S.

The controller H is configured to control the operation of the monitor 75 to cause the monitor 75 to display information indicating the control status of the plurality of the storage units 10S as well as the apparatus in which an abnormal condition occurred.

As described above, in the present embodiment, a bypass portion 72 is provided to allow communication between two storage unit feeding portions 63 that are paired. And guidance such as the operating procedure for the bypass switching valve 73 etc., is displayed on the monitor 75 after a retreating transport operation is completed.

Thus, an operator can manually operate the bypass switching valve 73 based on the information displayed on the monitor 75, the state of the nitrogen gas feed passages 60, and the state of apparatuses that are installed in the feed passages 60.

Figure 12:
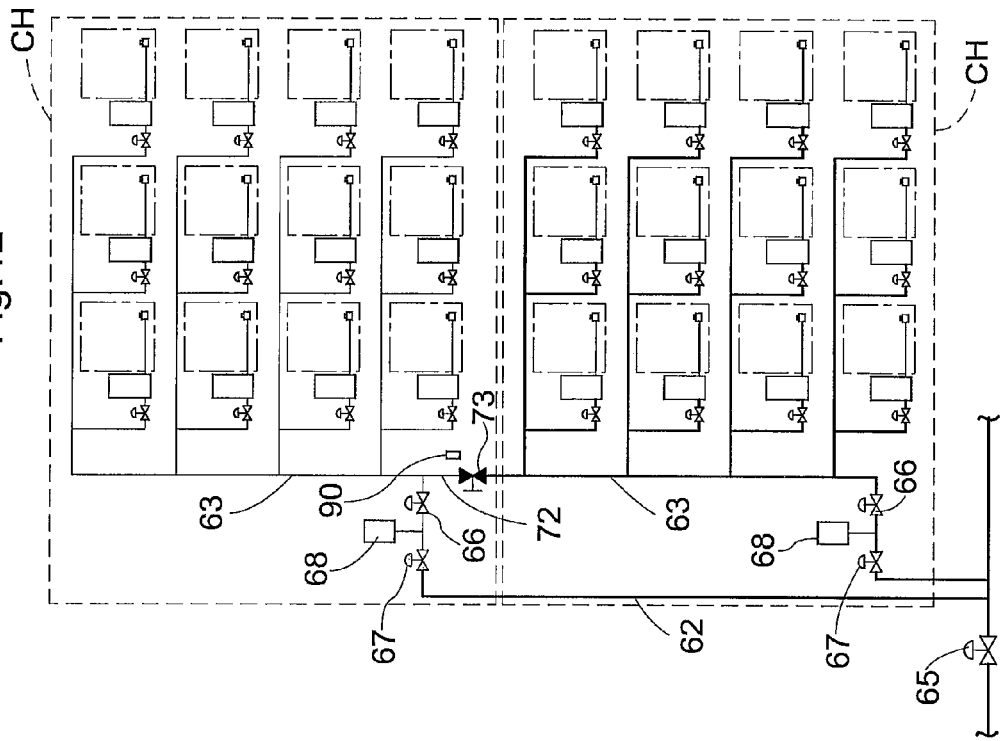
FIG. 12 shows how the inactive gas is supplied when a bypass switching valve is closed.
Figure 13:
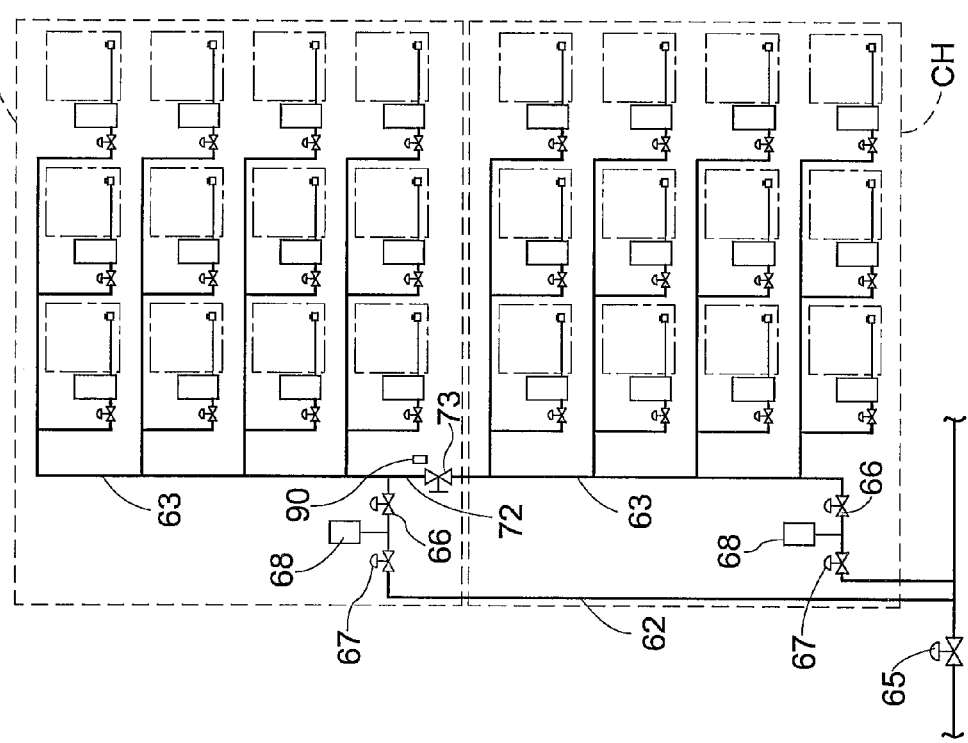
FIG. 13 shows how the inactive gas is supplied when the bypass switching valve is open.

As shown in FIGS. 12 and 13, a switched state detection sensor 90 which functions as a switched state detecting device is provided for detecting the changed state of each bypass switching valve 73. And the controller H is configured to manage the storage units 10S belonging to the subject section as disallowed storage units based on the detected information from the switched state detection sensor 90, if the bypass switching valve 73 provided in the bypass portion 72 connected to the storage unit feeding portion 63 of a subject section is closed. Here, as described above, a subject section is a section CH which is determined in a supply state determination based on the detected information from the section supply state detecting device S1 to be a section to which the nitrogen gas is not properly supplied. In other words, the controller H is configured to manage the storage unit 10S belonging to a specific section CH as disallowed storage units based on the detected information from the section supply state detecting device S1 and on the detected information from the switched state detection sensor 90. Here, the specific section CH is a section CH to which the nitrogen gas is not properly supplied and for which the bypass portion 72 connected to the storage unit feeding portion 63 of this section CH is in a state that prohibits passage of the nitrogen gas.

That is, for example, if an abnormal pressure signal is transmitted to the controller H because the pressure adjusting valve 67 associated with the upper section CH shown in FIG. 12 failed, then all of the storage units 10S belonging to that section CH are managed as disallowed storage units. In such a state, when the bypass switching valve 73 provided in the bypass portion 72 connected to the upper section CH is opened, then the nitrogen gas can be supplied as shown in FIG. 13, to the upper section CH from the lower section CH that is connected thereto by the bypass portion 72.

Thus, by opening the bypass switching valve 73, the upper section CH is no longer a specific section CH described above and the control status of the storage units 10S belonging to the upper section CH changes from disallowed storage units to allowed storage units. Therefore, they can be selected as the storage units 10S for storing containers 50 in a container carrying-in operation and thus can store the containers 50. They can also receive the containers 50 stored in other storage units 10S when the control status of those other storage units 10S is changed to disallowed storage units.

Note that the controller H may be configured to control the operation of the section valve 66 to close the section valve 66 belonging to the section CH (subject section) to which nitrogen gas is not properly supplied when the bypass switching valve 73 is opened based on the detected information from the section supply state detecting device S1 and the detected information from the switched state detection sensor 90.

Thus, with the bypass switching valve 73 switched to its closed state or position, the flow rate of the nitrogen gas supplied to the storage unit 10S can be adjusted for each section CH. With the structure described above, if the amount of inactive gas supplied to one or more storage units 10S decreases to below a proper supply amount or if the inactive gas is not supplied to one or more storage units 10S at all due to damage to a nitrogen gas feed passage 60 or failure of, for example, the devices, then the inactive gas can be allowed to flow from the storage unit feeding portion 63 of the section CH to which nitrogen gas is supplied properly to the storage unit feeding portion 63 of the section CH to which nitrogen gas is not supplied properly by opening the bypass switching valve 73.

ALTERNATIVE EMBODIMENTS (1) In the embodiment described above, each bypass portion 72 is configured to allow communication between two storage unit feeding portions 63 that belong to two sections CH that are adjacent each other in the vertical direction. However, the bypass portion 72 may be configured to allow communication between two storage unit feeding portions 63 that belong to two sections CH that are adjacent each other in the lateral or horizontal direction. In addition, the bypass portion 72 may be configured to allow communication between two storage unit feeding portions 63 that belong to two sections CH that are spaced apart from each other (with another section CH interposed therebetween) in the vertical or lateral direction.

(2) In the embodiment described above, the plurality of storage unit feeding portions 63 are divided into groups of two storage unit feeding portions 63. And each bypass portion 72 is configured to allow communication between the two of the plurality of storage unit feeding portions 63 in the same group. However, the plurality of storage unit feeding portions 63 may be divided into groups of three or more storage unit feeding portions 63, or may all be grouped together into one group. And bypass portions 72 may be configured to allow communication between or among the three or more in the same group or all of the storage unit feeding portions 63.

(3) In the embodiment described above, the switched state detection sensor 90 is provided as the switched state detecting device for detecting the switched state of the bypass switching valve 73, and the controller H is configured to determine whether the bypass portion 72 is in a state in which the inactive gas can be communicated therethrough or in a state in which the inactive gas cannot be communicated therethrough based on the detection state from the switched state detecting device. However, in replace of sensors (such as a opening-and-closing sensor, etc.), it is also possible to use a device that indirectly detects whether the bypass switching valve 73 is open or closed, as a switched state detecting device. For example, an input device with which an operator performs an input operation when operating the bypass switching valve 73 may be provided as the switched state detecting device. And the input device may detect whether the bypass switching valve 73 is open or closed based on an operator's input operation, upon which the detected information is transmitted to the controller H. In other words, with such arrangement, the controller H determines if the bypass portion 72 is in the state in which the inactive gas can be communicated therethrough or in the state in which the inactive gas cannot be communicated therethrough based on the input from the input device.

(4) In the embodiment described above, an example is described in which the substrates W are semiconductor wafers and the containers 50 to be transported are FOUPs. However, the invention is not limited to this: for example, the substrates W may be reticles and the transported containers 50 may be containers for reticles. In addition, although nitrogen gas is selected as an inactive gas in the embodiment, various kinds of gas, other than nitrogen gas, with low reactivity to the stored substrates W such as gaseous argon, etc., may be used as the inactive gas.

What is claimed is:
1. An article storage facility comprising:
   a controller;
   a plurality of storage units configured to store transporting containers for housing substrates;
   a transport device configured to transport the transporting containers to the plurality of storage units;
   inactive gas feed passages configured to supply inactive gas to each of the plurality of said storage units;
   a discharge portion configured to discharge the inactive gas supplied to an associated one of the storage units by an associated one of the inactive gas feed passages into the interior of an associated one of the transporting containers stored in the associated one of the storage units;

wherein the plurality of storage units are divided into a plurality of sections, wherein the inactive gas feed passages include section feeding portions which divert and supply the inactive gas to each of the plurality of sections, and storage unit feeding portions which divert and supply the inactive gas, that is supplied to a respective section by an associated one of the section feeding portions, to each of the plurality of storage units in the respective section, wherein the article storage facility further includes a bypass portion configured to allow communication between two or more of the storage unit feeding portions belonging to the different sections among the plurality of storage unit feeding portions;

a bypass switching valve located along the bypass portion that can be switched between an open state in which the inactive gas can be communicated through the bypass portion and a closed state in which the inactive gas cannot be communicated through the bypass portion;

wherein between each storage unit feeding portion diverting from the section feeding portion and the section feeding portion, at least one of a section valve switchable between an allowed state and a disallowed state and a pressure adjusting valve for adjusting a flow rate of the inactive gas communicated to the storage unit feeding portion is provided, the allowed state being a state in which the inactive gas can be communicated between the section feeding portion and said each storage unit feeding portion, the disallowed state being a state in which the inactive gas cannot be communicated between the section feeding portion and said each storage unit feeding portion; and the bypass portion is configured to allow communication between the different storage unit feeding portions without passing through the section valve and the pressure adjusting valve wherein the controller is configured to manage the storage units as disallowed storage units which are not allowed to house transporting containers, or as allowed storage units which are allowed to house transporting containers, based in part on a state of the bypass switching valve.

2. The article storage facility as defined in claim 1, wherein the storage unit feeding portions are divided into groups of two storage unit feeding portions, wherein the bypass portion is configured to allow communication between the two storage unit feeding portions in a same group.

3. The article storage facility as defined in claim 1, wherein
a storage shelf including the storage units arranged in a vertical direction and in a lateral direction is provided, and
wherein the bypass portion is configured to allow communication between the storage unit feeding portions of the sections that are adjacent each other in the vertical direction or in the lateral direction.

4. The article storage facility as defined in claim 1 further comprising:
a section supply state detecting device configured to detect a supply state of the inactive gas to an associated one of the plurality of sections;
a switched state detecting device configured to detect a switched state of the bypass switching valve;
wherein the controller is configured to perform a supply state determination which is a determination as to whether the inactive gas is properly supplied based on detected information from the section supply state detecting device;
wherein the section for which the controller determines in the supply state determination that the inactive gas is not properly supplied is designated as a subject section, and
wherein, if the bypass switching valve provided in the bypass portion communicated to the storage unit feeding portion of the subject section is in the closed state, the controller is configured to manage the storage units belonging to the subject section as disallowed storage units which are not allowed to house the transporting containers, based on detected information from the switched state detecting device.

5. The article storage facility as defined in claim 4, wherein the controller is configured to perform a retreating transport operation in which a transporting container, that is stored in one of the storage units that is changed to the disallowed storage unit due to a change in a supply state of the inactive gas, is transported to another one of the storage units that is not managed as the disallowed storage unit, based on detected information from the section supply state detecting device.

6. An article storage method using an article storage facility including:
a plurality of storage units configured to store transporting containers for housing substrates;
a transport device configured to transport the transporting containers to the plurality of storage units;
inactive gas feed passages configured to supply inactive gas to each of the plurality of said storage units; and
a discharge portion configured to discharge the inactive gas supplied to an associated one of the storage units by an associated one of the inactive gas feed passages into the interior of an associated one of the transporting containers stored in the associated one of the storage units;
wherein the plurality of storage units are divided into a plurality of sections,
wherein the inactive gas feed passages include section feeding portions which divert and supply the inactive gas to each of the plurality of sections, and storage unit feeding portions which divert and supply the inactive gas, that is supplied to a respective section by an associated one of the section feeding portions, to each of the plurality of storage units in the respective section,
wherein the article storage facility further includes a bypass portion configured to allow communication between two or more of the storage unit feeding portions belonging to the different sections among the plurality of storage unit feeding portions;
a bypass switching valve located along the bypass portion that can be switched between an open state in which the inactive gas can be communicated through the bypass portion and a closed state in which the inactive gas cannot be communicated through the bypass portion;
a section supply state detecting device configured to detect a supply state of the inactive gas to an associated one of the plurality of sections;
a switched state detecting device configured to detect a switched state of the bypass switching valve; and
a controller configured to perform a supply state determination which is a determination as to whether the inactive gas is properly supplied based on detected information from the section supply state detecting device;
wherein between each storage unit feeding portion diverting from the section feeding portion and the section feeding portion, at least one of a section valve switchable between an allowed state and a disallowed state and a pressure adjusting valve for adjusting a flow rate of the inactive gas communicated to the storage unit feeding portion is provided, the allowed state being a state in which the inactive gas can be communicated between the section feeding portion and said each storage unit feeding portion, the disallowed state being a state in which the inactive gas cannot be communicated between the section feeding portion and said each storage unit feeding portion; and the bypass portion is configured to allow communication between the different storage unit feeding portions without passing through the section valve and the pressure adjusting valve;

the article storage method comprising the following step that is performed by the controller:

a storage unit managing step in which any of the plurality of sections for which the controller determines in the supply state determination that the inactive gas is not properly supplied is designated as a subject section, and in which, if the bypass switching valve provided in the bypass portion communicated to the storage unit feeding portion of the subject section is in the closed state, the storage units belonging to the subject section are managed as disallowed storage units which are not allowed to house the transporting containers, based on detected information from the switched state detecting device, wherein in the storage unit managing step, if the bypass switching valve provided in the bypass portion communicated to the storage unit feeding portion of the subject section to which the disallowed storage units belong is in the open state, said disallowing storage units are managed as allowed storage units which are allowed to house the transporting containers.

7. The article storage method as defined in claim 6, wherein the steps performed by the controller further comprises a retreating transport operation step in which a transporting container, that is stored in one of the storage units that is changed to the disallowed storage unit due to a change in a supply state of the inactive gas, is transported to another one of the storage units that is not managed as the disallowed storage unit, based on detected information from the section supply state detecting device.

* * * * *

UNITED STATES PATENT AND TRADEMARK OFFICE
CERTIFICATE OF CORRECTION

| | | |
|---|---|---|
| PATENT NO. | : 9,230,845 B2 | Page 1 of 1 |
| APPLICATION NO. | : 13/723440 | |
| DATED | : January 5, 2016 | |
| INVENTOR(S) | : Hiroshi Otsuka et al. | |

It is certified that error appears in the above-identified patent and that said Letters Patent is hereby corrected as shown below:

Claims
Column 17, Line 40, Claim 1, delete "valve" and insert -- valve; and --

Signed and Sealed this
Twenty-sixth Day of April, 2016

Michelle K. Lee
*Director of the United States Patent and Trademark Office*